(12) United States Patent
Lin

(10) Patent No.: US 7,060,513 B2
(45) Date of Patent: Jun. 13, 2006

(54) METHOD OF TESTING FPC BONDING YIELD AND FPC HAVING TESTING PADS THEREON

(75) Inventor: Chia-Cheng Lin, Shioushuei Shiang (TW)

(73) Assignee: Toppoly Optoelectronics Corp., Miao-Li County (TW)

( * ) Notice: Subject to any disclaimer, the term of this patent is extended or adjusted under 35 U.S.C. 154(b) by 0 days.

(21) Appl. No.: 10/637,934

(22) Filed: Aug. 8, 2003

(65) Prior Publication Data

US 2004/0212386 A1 Oct. 28, 2004

(30) Foreign Application Priority Data

Apr. 23, 2003 (TW) .............................. 92109450 A

(51) Int. Cl.
G01R 31/26 (2006.01)
H01L 21/66 (2006.01)

(52) U.S. Cl. ........................... 438/14; 438/17; 438/18; 324/763; 324/765; 324/770

(58) Field of Classification Search ................. 438/14, 438/17, 18; 324/763, 765, 770
See application file for complete search history.

(56) References Cited

U.S. PATENT DOCUMENTS

| | | | |
|---|---|---|---|
| 6,332,669 B1* | 12/2001 | Kato et al. | 347/54 |
| 6,448,634 B1* | 9/2002 | Hashimoto | 257/668 |
| 6,777,973 B1* | 8/2004 | Morishita | 324/770 |
| 6,798,232 B1* | 9/2004 | Lim | 324/770 |
| 6,930,744 B1* | 8/2005 | Ukita | 349/152 |
| 6,982,569 B1* | 1/2006 | Lee et al. | 324/770 |
| 2002/0039802 A1* | 4/2002 | Ban et al. | 438/14 |
| 2002/0105263 A1* | 8/2002 | Kim | 313/498 |

* cited by examiner

Primary Examiner—W. David Coleman
Assistant Examiner—Khiem Nguyen
(74) Attorney, Agent, or Firm—J.C. Patents

(57) ABSTRACT

A flexible printed circuit (FPC) having testing pads thereon is provided. The FPC comprises a plurality of bonding pads and a plurality of testing pads, wherein each of the testing pads is disposed corresponding to each of the bonding pads, and the testing pads are electrically isolated from the bonding pads. After the bonding pads of the FPC are bonded to pins of a display, the testing pads are electrically connected to the bonding pads on the FPC via the pins of the display. Therefore, the FPC bonding yield can be determined by measuring the electrical property of the testing pads.

8 Claims, 2 Drawing Sheets

METHOD OF TESTING FPC BONDING YIELD AND FPC HAVING TESTING PADS THEREON

BACKGROUND OF THE INVENTION

1. Field of Invention

The present invention relates to a method for testing the flexible printed circuit(FPC) bonding yield and an FPC structure, and more particularly, to a method for testing the bonding yield between an FPC and a display, and an FPC having testing pads thereon.

2. Description of Related Art

The panel display is generally connected to an external system after the manufacturing process is completed, so as to supply an electric power and drive the panel display. The method commonly used for connecting the panel display to the external system presses the FPC onto an edge portion of the panel display, so that the circuit of the panel display is electrically connected to the circuit of the FPC. Since the other end of the FPC is connected to an external system, the panel display is connected to the external system via the connection provided by the FPC. However, since the FPC is weak and can be damaged by external forces, the reliability for the bonding between the FPC and the panel display is rather weak. Therefore, a bonding yield test should inevitably be performed after the FPC is bonded to the panel display.

The method for testing the bonding yield between the FPC and the panel display used in the prior art employs an optical microscope to check the bonding status of the FPC, or tests a bonding strength of the FPC by performing a pull force testing after the FPC is bonded. However, the conventional measuring method cannot measure the electrical property of the bonding for determining whether the panel display can work properly or not.

In the conventional method for measuring the electrical property of the bonding for determining whether the panel display can work properly or not, a light on process is commonly performed after the FPC is bonded to the panel display, so that it is ensured that the FPC is successfully bonded to the panel display. However, there is a problem existing in the method mentioned above for ensuring that the FPC is successfully bonded to the panel display, that is in the case where an abnormal image appears on the panel display and it is not sure whether it is caused by a bonding defect occurring between the FPC and the display or caused by a malfunction of a component inside the panel display. It is very complicated and hard to find the root cause of the abnormal image.

SUMMARY OF THE INVENTION

It is an object of the present invention to provide a method for testing the FPC bonding yield and an FPC having the testing pads thereon, so as to solve the problem that occurred in the prior art in which the measuring of the electrical property for determining whether the panel display can work properly or not could not be performed.

It is a further object of the present invention to provide a method for testing the FPC bonding yield and an FPC having the testing pads thereon, so as to solve the problem that occurred in the conventional measuring method, where whether the problem was caused by a bonding defect occurring between the FPC and the display or caused by the malfunction of the component inside the panel display when an abnormal image appears on the panel display was not sure.

The present invention provides a method for testing the FPC bonding yield. The method first provides an FPC, wherein the FPC comprises a plurality of bonding pads. Then, a plurality of testing pads is disposed on the FPC, wherein each of the testing pads is disposed corresponding to each of the bonding pads, and the testing pads are electrically isolated from the bonding pads. In the present invention, the method for disposing the testing pads on the FPC is forming a plurality of conductive pads on the FPC, wherein the conductive pads are made of a material, such as copper. Furthermore, a plurality of openings is formed on the FPC, and the openings expose the pins of the apparatus that are to be bonded after the subsequent FPC bonding process is completed. Meanwhile, an apparatus to be bonded such as a liquid crystal display is provided, and the apparatus comprises a plurality of pins thereon. Then, a bonding process is performed, so that the bonding pads and the testing pads of the FPC are electrically connected to the pins of the apparatus. A testing signal is then input to the FPC, and an output signal is measured from the testing pads, so as to determine the bonding yield between the FPC and the apparatus. If the output signal measured from the testing pads indicates it is abnormal, it means the bonding between the FPC and the apparatus is poor.

The present invention provides a method for testing the FPC bonding yield. The method first provides an FPC, wherein the FPC comprises a plurality of bonding pads. An apparatus to be bonded such as a liquid crystal display is provided, and the apparatus comprises a plurality of pins thereon. Then, a boding process is performed, so that the bonding pads of the FPC are electrically connected to the pins of the apparatus, wherein the flexible printed circuit expose a portion of the pins of the apparatus. A testing signal is then input to the FPC, and an output signal is measured from the exposed pins, so as to determine the bonding yield between the FPC and the apparatus. If the output signal measured from the exposed pins indicates it is abnormal, it means the bonding between the FPC and the apparatus is poor.

The present invention provides an FPC having the testing pads. The FPC comprises a plurality of bonding pads and a plurality of testing pads, wherein each of the testing pads is disposed corresponding to each of the bonding pads, and each of the testing pads is electrically isolated from each of the bonding pads. In the present invention, the testing pads on the FPC are such as a plurality of conductive pads, wherein the conductive pads are made of a material, such as copper. Furthermore, the testing pads mentioned above may be a plurality of openings.

The present invention provides a method for forming an FPC having testing pads. An FPC having a plurality of bonding pads thereon is provided. A plurality of testing pads is formed on the FPC, wherein each of the testing pads is formed corresponding to each of the bonding pads, and each of the testing pads is electrically isolated from the bonding pads. In the present invention, the testing pads on the FPC are such as a plurality of conductive pads, wherein the conductive pads are made of a material, such as copper. Furthermore, the testing pads mentioned above may be a plurality of openings.

The testing method provided by the present invention immediately knows the bonding effect of the FPC, so as to improve the product yield and shorten the product manufacturing process.

Further, since the present invention can immediately know whether the FPC bonding is successful or not, and when it is found that the FPC bonding has failed, the FPC bonding process is immediately reperformed, so as to enhance the product yield.

Furthermore, since the measuring method of the present invention clearly indicates whether the abnormal image is caused by the poor bonding of the FPC or not, the present invention can shorten the time for finding the root cause of the abnormal condition when the product malfunctions.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION OF THE PREFERRED EMBODIMENTS

Figure 1:
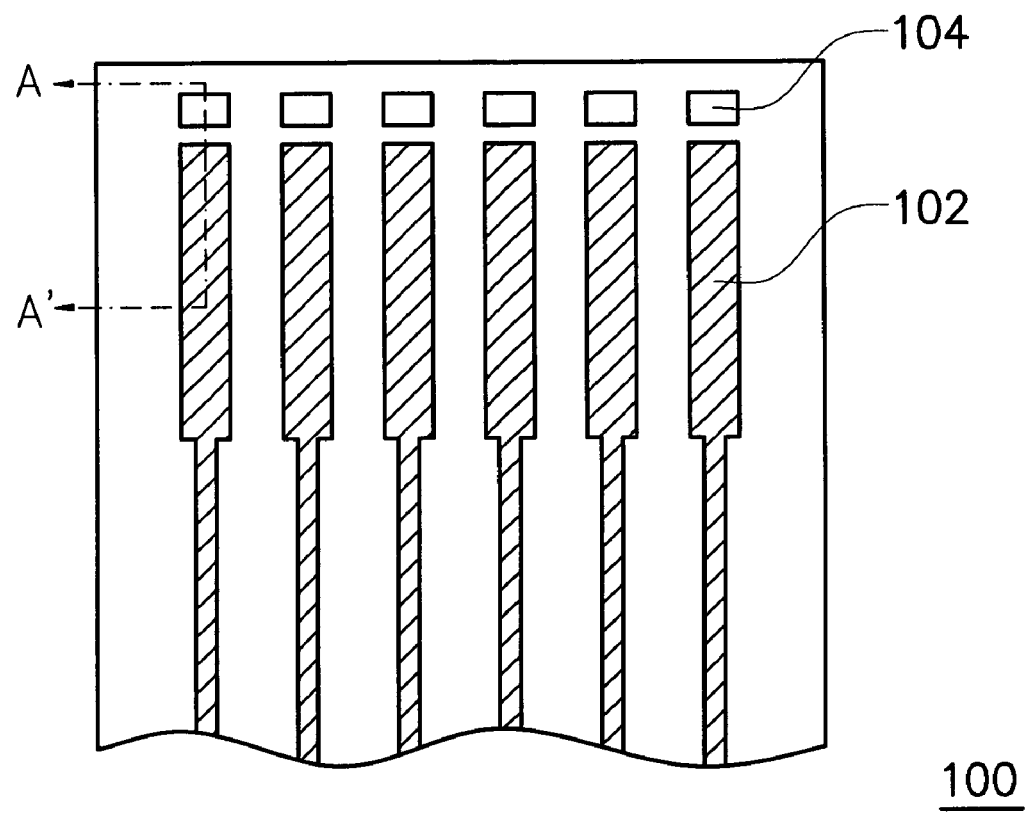
FIG. 1 schematically shows a top view of a FPC of a preferred embodiment according to the present invention.
Figure 2:
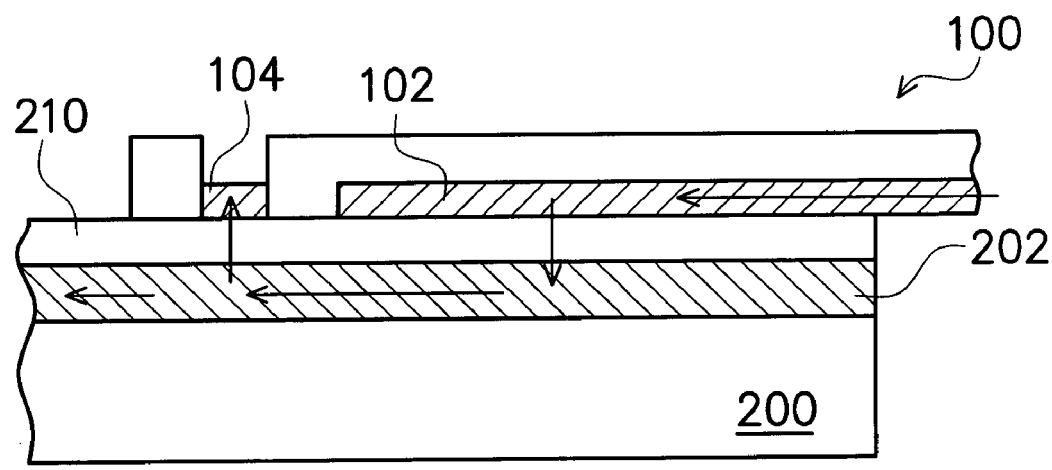
FIG. 2 is a diagram for testing the FPC bonding yield of a preferred embodiment according to the present invention.

FIG. 1 schematically shows a top view of an FPC of a preferred embodiment according to the present invention, and FIG. 2 is a diagram for testing the FPC bonding yield of a preferred embodiment according to the present invention.

Referring to both FIG. 1 and FIG. 2, the method for testing the FPC bonding yield provided by the present invention first provides an FPC 100, wherein the FPC 100 comprises a plurality of bonding pads 102. Then, a plurality of testing pads 104 is disposed on the FPC 100, wherein each of the testing pads 104 is disposed corresponding to each of the bonding pads 102, and the testing pads 104 are electrically isolated from the bonding pads 102.

In a preferred embodiment, the method for disposing the testing pads 104 on the FPC 100 is such as forming a plurality of conductive pads 104 on the FPC 100, and its sectional view (the A–A' sectional view) is as shown in FIG. 2. The conductive pads 104 are made of a material such as copper.

Referring to FIG. 2, meanwhile, an apparatus 200 such as a display is provided, wherein the display 200 comprises a plurality of pins 202. Then, a bonding process is performed, so that the bonding pads 102 and the testing pads 104 of the FPC 100 are electrically connected to the pins 202 of the display 200. In a preferred embodiment, the bonding process is such as disposing a layer of the anisotropic conductive adhesive 210 in between the FPC 100 and the display 200, then a pressing step is performed, so that the conductive particles inside the anisotropic conductive adhesive are contacted with each other, and the bonding pads 102 and the testing pads 104 of the FPC 100 are further electrically connected to the pins 202 of the display 200.

A testing signal is then input to the FPC 100, and the testing signal is sent to the pins 202 of the display 200 via the bonding pads 102 and the anisotropic conductive adhesive 210, and further sent to the testing pads 104 via the pins 202 and the anisotropic conductive adhesive 210. Therefore, if the FPC bonding is good, a normal output signal is measured from the testing pads 104. In other words, the present invention determines the bonding yield between the FPC 100 and the display 200 by inputting a testing signal into the FPC 100, and measuring an output signal from the testing pads 104. If the output signal measured from the testing pads 104 is abnormal, it means the bonding between the FPC 100 and the display 200 is poor.

Figure 3:
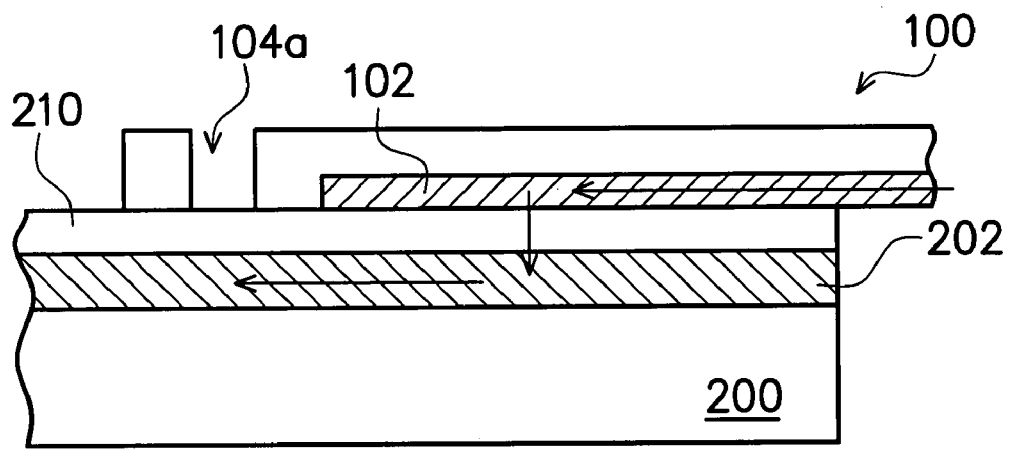
FIG. 3 is a diagram for testing the FPC bonding yield of another preferred embodiment according to the present invention.

Furthermore, the method for testing the FPC bonding yield provided by the present invention forms a plurality of openings 104a on the FPC 100, and the openings 104a are used as the testing pads as shown in FIG. 3. After the FPC 100 is bonded to the display 200 with the help of the anisotropic conductive adhesive 210, the bonding pads 102 of the FPC 100 are electrically connected to the pins 202 of the display 200, and the openings 104a on the FPC 100 expose the anisotropic conductive adhesive 210 corresponding to the pins 202.

Then, a testing signal is input into the FPC 100, and the testing signal is then sent to the pins 202 of the display 200 via the bonding pads 102 and the anisotropic conductive adhesive 210. If the FPC bonding is good, a normal output signal can be measured from the anisotropic conductive adhesive 210, which is exposed and correspond to the pins 202, via the openings 104a. In other words, the present invention determines the bonding yield between the FPC 100 and the display 200 by inputting a testing signal into the FPC 100, and measuring an output signal from the anisotropic conductive adhesive 210, which is exposed by the openings 104a and correspond to the pins 202. If the measured output signal is abnormal, it means the bonding between the FPC 100 and the display 200 is poor.

The FPC 100 having the testing pads 104 provided by the present invention comprises a plurality of bonding pads 102 and a plurality of testing pads 104, wherein each of the testing pads 104 is electrically isolated to each of the bonding pads 102. In the present invention, the testing pads 104 on the FPC 100 are such as a plurality of conductive pads (as shown in FIG. 2) thereon, and the conductive pads are made of a material, such as copper. Further, the testing pads 104 also can be a plurality of openings (as shown in FIG. 3), and the openings 104a expose the pins of the display after the subsequent bonding process is completed.

A method for forming the FPC 100 having the testing pads 104 is also provided. Firstly, an FPC 100 having a plurality of bonding pads 102 thereon is provided. Then, a plurality of testing pads 104 are formed on the FPC 100, wherein each of the testing pads 104 is formed corresponding to each of the bonding pads 102, and each of the testing pads 104 is electrically isolated from the bonding pads 102. In the present invention, the testing pads 104 on the FPC 100 can be a plurality of conductive pads (as shown in FIG. 2), wherein the conductive pads are made of a material, such as copper. Furthermore, the testing pads 104 mentioned above may be a plurality of openings 104a (as shown in FIG. 3), and the openings 104a expose the pins of the display after the subsequent bonding process is completed.

Figure 4:
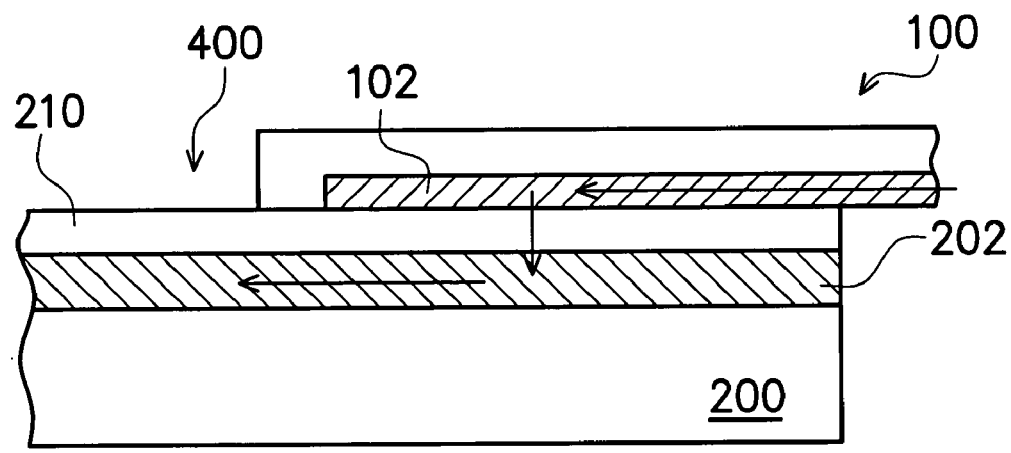
FIG. 4 is a diagram for testing the FPC bonding yield of another preferred embodiment according to the present invention.

In another embodiment of the invention, as shown in FIG. 4, a method for testing the FPC bonding yield first provides an FPC 100 having a plurality of bonding pads 102 thereon. An apparatus 200 to be bonded such as a display is provided, and the apparatus 200 comprises a plurality of pins 202 thereon. Then, a boding process is performed, so that the bonding pads 102 of the FPC 100 are electrically connected to the pins 202 of the apparatus 200, wherein the flexible printed circuit 100 expose a portion of the pins 202 (as region 400). In a preferred embodiment, the bonding process is such as disposing a layer of the anisotropic conductive adhesive 210 in between the FPC 100 and the display 200, then a pressing step is performed, so that the conductive particles inside the anisotropic conductive adhesive are contacted with each other, and the bonding pads 102 are electrically connected to the pins 202 of the display 200.

Then, a testing signal is input into the FPC 100, and the testing signal is then sent to the pins 202 of the display 200 via the bonding pads 102 and the anisotropic conductive adhesive 210. If the FPC bonding is good, a normal output signal can be measured from the anisotropic conductive adhesive 210, which is the region 400 exposed by the FPC 100. In other words, the present invention determines the bonding yield between the FPC 100 and the display 200 by inputting a testing signal into the FPC 100, and measuring an output signal from the anisotropic conductive adhesive 210, which is the region 400 exposed by the FPC 100. If the measured output signal is abnormal, it means the bonding between the FPC 100 and the display 200 is poor.

The method for testing FPC bonding yield provided by the present invention immediately knows the bonding effect of the FPC, so as to improve the product yield and shorten the product manufacturing process.

Further, the present invention can immediately know whether the FPC bonding is successful or not, and when it is found that the FPC bonding has failed, the FPC bonding process is immediately reperformed, so as to enhance the product yield.

Furthermore, since the measuring method of the present invention clearly indicates whether the abnormal image is caused by the poor bonding of the FPC or not, the present invention can shorten the time for finding the root cause of the abnormal condition when the product malfunctions.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A method for testing a flexible printed circuit (FPC) bonding yield, comprising:

providing a flexible printed circuit having a plurality of bonding pads thereon;

disposing a plurality of testing pads on the flexible printed circuit, wherein each of the testing pads is disposed corresponding to each of the bonding pads, and the testing pads are electrically isolated from the bonding pads;

providing a liquid crystal display having a plurality of pins thereon;

performing a bonding process, so that each of the bonding pads and the corresponding testing pad of the flexible printed circuit are electrically connected to the same pin of the liquid crystal display;

inputting a testing signal into the flexible printed circuit; and measuring an output signal from the testing pads, so as to determine the bonding yield between the flexible printed circuit and the liquid crystal display.

2. The method for testing the flexible printed circuit bonding yield of claim 1, wherein the method for disposing the testing pads on the flexible printed circuit is by forming a plurality of conductive pads on the flexible printed circuit.

3. The method for testing the flexible printed circuit bonding yield of claim 2, wherein the conductive pads are made of copper.

4. The method for testing the flexible printed circuit bonding yield of claim 1, wherein the bonding process comprises:

disposing an anisotropic conductive adhesive in between the flexible printed circuit and the liquid crystal display; and performing a pressing step, so that the bonding pads and the testing pads of the flexible printed circuit are electrically connected to the pins of the liquid crystal display.

5. A method for testing a flexible printed circuit bonding yield, comprising:

providing a flexible printed circuit having a plurality of bonding pads thereon;

forming a plurality of openings on the flexible printed circuit, wherein each of the openings is disposed corresponding to each of the bonding pads respectively, and the openings are separated from the bonding pads;

providing a liquid crystal display having a plurality of pins thereon;

performing a bonding process, so that each of the bonding pads of the flexible printed circuit is electrically connected to the corresponding pin respectively, wherein each of the openings of the flexible printed circuit exposes one pin which is electrically connected to the bonding pad corresponding to the opening itself;

inputting a testing signal into the flexible printed circuit, and measuring an output signal from the pins exposed by the openings, so as to determine the bonding yield between the flexible printed circuit and the liquid crystal display.

6. The method for testing the flexible printed circuit bonding yield of claim 5, wherein the bonding process comprises:

disposing an anisotropic conductive adhesive in between the flexible printed circuit and the liquid crystal display; and performing a pressing step, so that the bonding pads of the flexible printed circuit are electrically connected to the pins of the liquid crystal display.

7. A method for testing a flexible printed circuit bonding yield, comprising:

providing a flexible printed circuit having a plurality of bonding pads thereon;

providing a liquid crystal display having a plurality of pins thereon, wherein each pin is corresponding to one bonding pad;

performing a bonding process, so that the bonding pads of the flexible printed circuit are electrically connected to the corresponding pins of the liquid crystal display respectively, wherein the flexible printed circuit expose a portion of the pins bonding with the bonding pads respectively;

inputting a testing signal into the flexible printed circuit; and measuring an output signal from the exposed pins, so as to determine the bonding yield between the flexible printed circuit and the liquid crystal display.

8. The method for testing the flexible printed circuit bonding yield of claim 7, wherein the bonding process comprises:

disposing an anisotropic conductive adhesive in between the flexible printed circuit and the liquid crystal display; and performing a pressing step, so that the bonding pads of the flexible printed circuit are electrically connected to the pins of the liquid crystal display.

* * * * *